United States Patent
Ameen et al.

[11] Patent Number: 5,926,737
[45] Date of Patent: Jul. 20, 1999

[54] USE OF TICL$_4$ ETCHBACK PROCESS DURING INTEGRATED CVD-TI/TIN WAFER PROCESSING

[75] Inventors: Michael S. Ameen, Phoenix; Gert Leusink, Tempe; Joseph T. Hillman, Scottsdale, all of Ariz.

[73] Assignee: Tokyo Electron Limited, Tokyo, Japan

[21] Appl. No.: 08/914,673

[22] Filed: Aug. 19, 1997

[51] Int. Cl.$^6$ ............................................. H01L 21/4763
[52] U.S. Cl. ..................... 438/649; 438/655; 438/664; 438/682; 438/683
[58] Field of Search ................................... 438/649, 655, 438/664, 682, 683

[56] References Cited

U.S. PATENT DOCUMENTS

| | | | |
|---|---|---|---|
| 5,273,588 | 12/1993 | Foster et al. | 118/723 |
| 5,308,655 | 5/1994 | Eichman et al. | 427/248.1 |
| 5,356,476 | 10/1994 | Foster et al. | 118/725 |
| 5,434,110 | 7/1995 | Foster et al. | 437/245 |
| 5,628,829 | 5/1997 | Foster et al. | 118/723 |

*Primary Examiner*—John F. Niebling
*Assistant Examiner*—David A. Zarneke
*Attorney, Agent, or Firm*—Wood, Herron & Evans, L.L.P.

[57] ABSTRACT

A method of using titanium chloride to etchback CVD-Ti on a patterned oxide wafer and the product formed by this process. Titanium is deposited onto a wafer composed of a silicon base and a pattern oxide layer which exposes portions of the silicon. The titanium is deposited onto the wafer by CVD-Ti. The titanium is deposited as metallic Ti on the oxide layer and reacts with the silicon substrate to form titanium silicide. The wafer is then exposed to a flow of titanium tetrachloride (TiCl$_4$) gas. The TiCl$_4$ etches away the metallic Ti on the oxide layer and does not substantially etch the titanium silicide. Optionally titanium nitride and tungsten may then be deposited on the substrate.

23 Claims, 4 Drawing Sheets ns. 5,926,737

USE OF TICL₄ ETCHBACK PROCESS DURING INTEGRATED CVD-TI/TIN WAFER PROCESSING

BACKGROUND OF THE INVENTION

It is frequently desired to deposit a film of titanium nitride over a film of titanium to prevent chemical attack of titanium by fluoride gas liberated in a subsequent tungsten deposition step. The commonly-used methods of forming titanium and titanium nitride films are generally incompatible. The titanium can be sputter deposited or deposited by plasma-enhanced chemical vapor deposition wherein titanium nitride is generally formed by low pressure chemical vapor deposition. In the formation of integrated circuits, metal may be deposited over a metal oxide semiconductor structure to react with exposed silicon areas such as source and drain regions to form metal silicides. Following the formation of the silicide regions, a selective acid etch has been used to remove unreacted metals without attacking the silicide. After the CVD is completed, the substrate is removed from the reactor, allowed to cool to room temperature and etched with an acid such as a mixture of hydrogen peroxide and sulfuric acid. This etch will remove any metallic titanium on the substrate as well as any substoichiometric TiSix formed on the silicon dioxide. This method of forming suicides is disclosed in U.S. patent application Ser. No. 08/489,040 entitled METHOD FOR FORMING SALICIDES, filed Jun. 9, 1995 (inventor Arena) herein incorporated in its entirety by reference.

Sputter deposition requires the utilization of a separate reaction chamber. In applications where a first film is deposited by chemical vapor deposition, which is the preferred method, followed by sputter deposition of a second film, two different chambers are required. This could then be followed by a third chamber where, for example, a metal layer would be sputter deposited. It is preferable to minimize the transport of the substrate from one reaction chamber to another and to conduct as many reactions as possible in a single chamber.

While physical sputtering provides deposition of a titanium film at a lower temperature, sputtering processes have various drawbacks. Sputtering normally yields very poor step coverage. Step coverage is defined as the ratio of film thickness on the bottom of a contact on a substrate wafer to the film thickness on the sides of the contact or the top surface of the substrate. Consequently, to sputter deposit a predetermined amount of titanium at the bottom of a contact or via, a larger amount of the sputtered titanium must be deposited on the top surface of the substrate or the sides of the contact. For example, in order to deposit a 200 Å film at the bottom of a contact using sputtering, a 600 Å to 1000 Å film layer may have to be deposited onto the top surface of the substrate or the sides of the contact. Since the excess titanium has to be etched away, sputtering is wasteful and costly when depositing layers containing titanium.

The step coverage of the contact with sputtering techniques decreases as the aspect ratio of the contact or via increases. The aspect ratio of a contact is defined as the ratio of contact depth to the width of the contact. Therefore, a thicker sputtered film must be deposited on the top or sides of a contact that is narrow and deep (high aspect ratio) in order to obtain a particular film thickness at the bottom of the contact than would be necessary with a shallow and wide contact (low aspect ratio). In otherwords, for smaller device dimensions in an IC, corresponding to high aspect ratio contacts and vias, sputtering is even more inefficient and wasteful. The decreased step coverage during sputter deposition over smaller devices results in an increased amount of titanium that must be deposited, thus increasing the amount of titanium applied and etched away, increasing the titanium deposition time, and increasing the etching time that is necessary to remove excess titanium. Accordingly, as IC device geometries continue to shrink and aspect ratios increase, deposition of titanium-containing layers by sputtering becomes very costly.

There are significant costs associated with each individual process that decreases the throughput of a IC chip processor. This includes the time to heat a wafer, stabilize the reaction chamber pressure and gas flows, and stabilize rotation. The acid etch step described above significantly reduces the manufacturing rate. By transferring the wafer from station to station, there is a time delay, in this case, between the deposition of the titanium and subsequent nitridation and deposition of the titanium nitride film. During this time, the titanium film will undergo oxidation which can degrade the electrical properties of the film.

Previously, titanium and titanium nitride have typically been deposited using physical vapor deposition (PVD) methods such as sputtering. Using PVD, thick films of Ti and TiN must be deposited on the top layers of the device in order to achieve adequate bottom coverage.

FIELD OF THE INVENTION

A chemical vapor deposition (CVD) based solution to contact level metallurgy based on the use of plasma-enhanced chemical vapor deposition of Ti (PE-CVD-Ti) to form a titanium silicide barrier layer followed by removal of the metallic titanium followed by low pressure chemical vapor deposition of titanium nitride in a single cluster processing tool is sought. One method of forming a barrier layer which is currently being explored is set forth in U.S. patent application, Ser. No. 08/965,658 filed Nov. 6, 1997, entitled "Elimination of TiN Film in W Plug Technology Using PECVD-Ti and In-Situ Plasma Nitridation" (Inventor, Ameen et al.), herein incorporated in its entirety by express reference includes the steps of: 1) pre-cleaning the silicon wafer with hydrofluoric acid or a soft etch process; 2) deposition of titanium by PE-CVD to form metallic Ti on the oxide layer and $TiSi_2$ on the exposed silicon in the contacts; 3) nitridation with $NH_3$ plasma to passivate the metallic Ti; and 4) deposition of a bi-layer of titanium nitride by LP-CVD. The lower level of the bi-layer is a depletion mode TiN having a low chlorine content to minimize the $TiCl_4$ attack on the underlying Ti layer and the upper layer is formed by a saturation mode layer of TiN which has a high step coverage.

Studies have indicated that Ti film depositions greater than about 250 Å in a Ti/TiN film stack would peel at the oxide/Ti interface due to the attack of the metallic Ti by the high $TiCl_4$ flow used during the saturation mode deposition process. The nitridation and bi-layer TiN deposition process were designed to passivate the Ti underlayer and minimize the chlorine content at the Ti/TiN interface to eliminate this etching. However, the effect of these steps adds to process complexity, reduces throughput and degrades step coverage of the TiN film.

SUMMARY OF THE INVENTION

According to the present invention, a silicon substrate having an oxide barrier layer which is patterned to expose portions of the silicon substrate is deposited with a CVD-Ti film. The titanium forms a metallic Ti layer over the oxide barrier layer but forms a titanium suicide ($TiSi_2$) layer on the exposed silicon. Immediately after depositing the film, the titanium layer is exposed to a flow of $TiCl_4$. The $TiCl_4$ etches away the exposed metallic Ti but does not etch the $TiSi_2$ on the exposed silicon. The formation of the $TiSi_2$ layer obviates the need for several processing steps such as: removal of non-uniform Ti deposited on the oxide layer, elimination of a plasma nitridation step to passivate the Ti to the ensuing CVD-TiN deposition, and depletion mode TiN deposition prior to saturation mode TiN deposition. The result is improved throughput of the wafer processor and improved $TiSi_2$ barrier properties resulting from the layer.

U.S. patent application Ser. No. 08/253,978, entitled *Low Temperature Plasma-Enhanced Formation of Integrated Circuits,* filed Jun. 3, 1994, (Inventor Joseph T. Hillman et al.), herein incorporated by reference in its entirety discloses the application of various film by PE-CVD-Ti.

According to the present invention, the pressure in the reaction chamber is stabilized at less than about 10 torr, the wafer temperature is then stabilized at a temperature of about 400–650° C. and a titanium film is deposited by plasma-enhanced chemical vapor deposition to form $TiSi_2$ on exposed silicon. The metallic Ti on the oxide layer is then removed by the flow of an etchant gas such as a titanium tetrahalide. A TiN layer is then deposited over the $TiSi_2$ and the oxide. The substrate can then be removed from the reaction chamber and directed to a subsequent process module or processed in the same module used for TiN deposition.

The objects and advantages of the present invention will be further appreciated in light of the following detailed description and drawings. In which:

DETAILED DESCRIPTION

According to the present invention, a silicon substrate having an oxide barrier layer which is patterned to expose portions of the silicon substrate is deposited with a CVD-Ti film. The titanium forms a metallic Ti layer over the oxide barrier layer but forms a titanium silicide ($TiSi_2$) layer on the exposed silicon. Immediately after depositing the film, the titanium layer is exposed to a flow of $TiCl_4$. The $TiCl_4$ etches away the exposed metallic Ti but does not etch the $TiSi_2$ on the exposed silicon.

Figure 1:
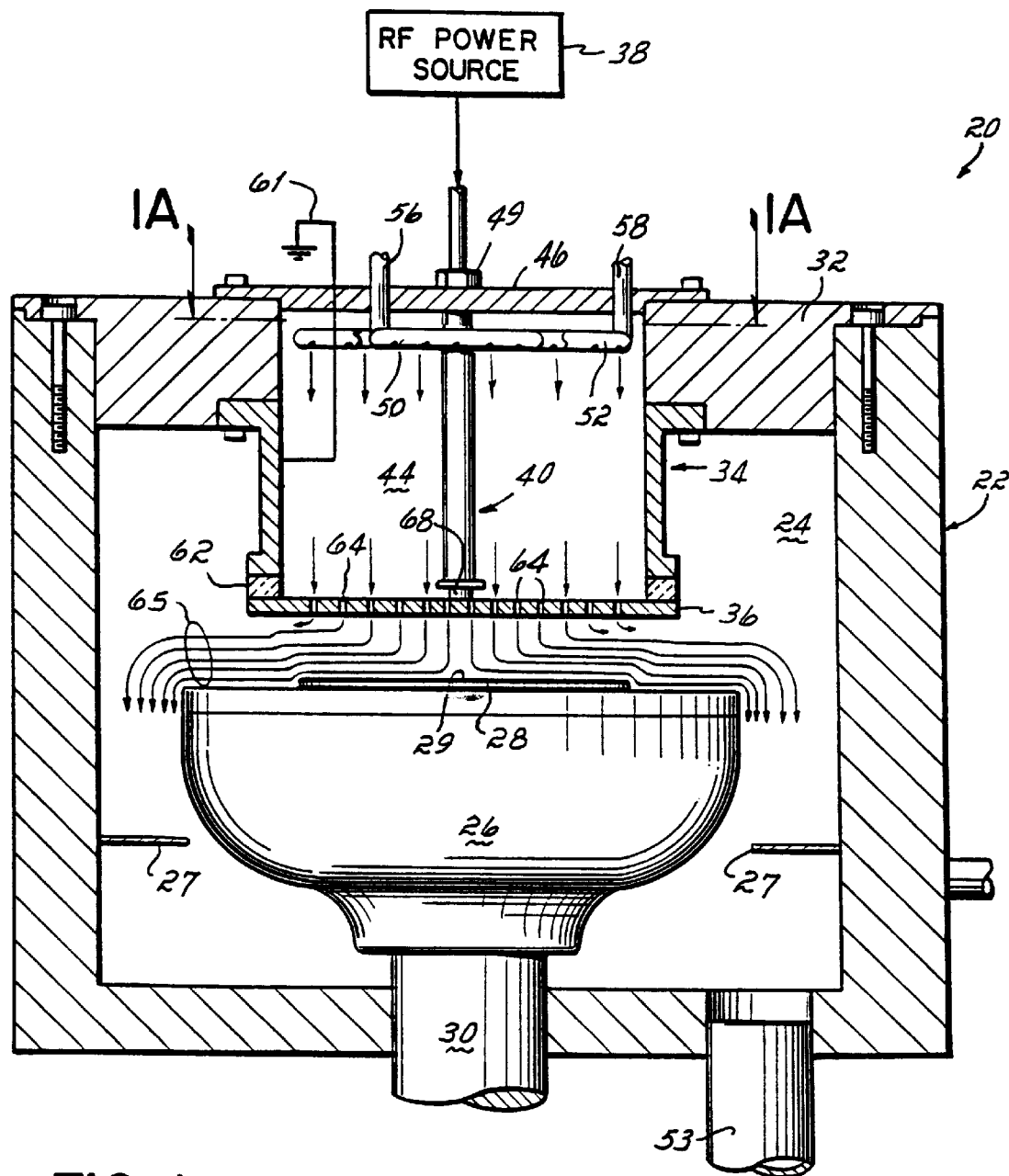
FIG. 1 is a side view, partially in cross-section, of a deposition chamber used to practice the methods of the present invention.
Figure 1A:
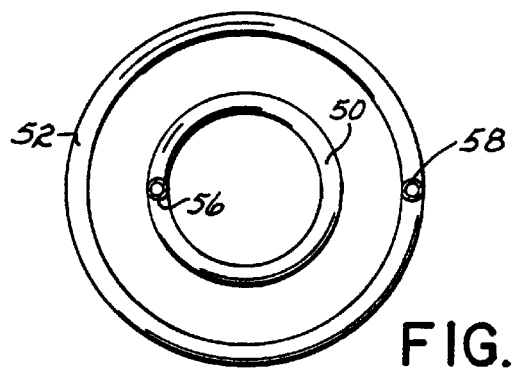
FIG. 1A is a top plan view of the concentric gas injectors taken along line A—A of FIG. 1.

Although not limited to any particular apparatus, one preferred apparatus for use in the present invention is a CVD reactor 20 shown in FIG. 1.

Reactor 20, and specifically reaction space 24 within housing 22, may be selectively evacuated. In this application, the reaction space will be evacuated to 0.5 to 10 torr. The susceptor 26 is coupled to a variable speed motor (not shown) by shaft 30 such that the susceptor 26 and substrate 28 may be rotated at various speeds such as between 0 and 2,000 rpm. Susceptor 26 includes a resistance heating element (not shown) coupled to the susceptor 26 to heat substrate 28, and is electrically grounded by suitable means (not shown).

Extending downwardly from the top wall 32 of housing 22 is a cylinder assembly 34 which is attached to a gas-dispersing showerhead 36. Showerhead 36 is coupled to an RF energy source 38 by an appropriate RF feed line assembly 40 which extends through cover 46 which may, if necessary, include a heat pipe to dissipate unwanted heat. A sealing structure 49 seals the opening around feed line assembly 40. Plasma source gas and reactant gas are introduced into flow passage 44 by concentric rings or halos 50, 52. The concentric rings 50, 52 include a number of holes which evenly dispense the gases around the flow passage 44. Ring 50 is connected to a gas supply through line 56, while ring 52 is connected to a supply by line 58.

Insulator ring 62 separates cylinder 34 and showerhead 36, to electrically isolate one from the other. Cylinder 34 is electrically grounded by ground line 61. The insulator ring 62 preferably has an outer diameter approximately the same as the outer diameter of showerhead 36 and a width which ensures complete separation of cylinder 34 and showerhead 36 along the entire attachment interface between the cylinder and showerhead. The insulator ring is preferably made of quartz material approximately 0.75 inches thick.

Showerhead electrode 36 contains a plurality of dispersion holes 64 which disperse the flow of gas over substrate 28. The showerhead 36 includes a stem 68. Stem 68 is formed integrally with the showerhead 36 and forms part of the RF line assembly 40 which connects to showerhead 36. The showerhead 36, including stem 68, is formed of an electrically conductive material, preferably Nickel-200.

The RF power source, through RF feed line assembly 40, biases the showerhead 36 so that the showerhead functions as an RF electrode. The grounded susceptor 26 forms another parallel electrode. An RF field is created, preferably between showerhead 36 and susceptor 26. The RF field created by the biased showerhead/electrode 36 excites the plasma gases, for example nitrogen, hydrogen and argon gases, which are dispensed through holes 64 so that a plasma is created below showerhead/electrode 36.

The showerhead employed is about 6 mm thick, having a diameter of about 17.3 cm and 600 holes. The number of holes is not critical and could easily be varied from 100 holes to 1,000 or more holes. The holes are preferably less than 1.5 mm in diameter and are more preferably about 0.75 mm. This prevents the plasma from being generated in the hole, which reduces efficiency.

Gas flow injector rings are preferably connected through appropriate valving (not shown) to the following gas supplies: $H_2$, titanium tetrahalide, $N_2$, $NH_3$, Ar, and $WF_6$ (gas supplies not shown) to selectively enable one or more of these gases to be supplied to the cylinder 34. The gas flow from injector rings 50 and 52 is allowed to develop within the length of the cylinder 34 as it travels to the showerhead 36. It is desirable for the velocity profile of the incoming plasma gases passing through showerhead 36 to be fully developed before they reach the rotating surface of the substrate 28. Due to the proximity of the showerhead to the surface, the profile must develop in the cylinder 34.

Preferably, the showerhead 36 can be from about 10 cm to about 10 millimeters from susceptor 26, with 20 mm preferred. It is preferred to have the showerhead as close as possible to the substrate surface 29 while still permitting the substrate or wafer to be removed, although this is not critical for practicing the present invention.

A pumping effect is created by the rotating susceptor 26, as described in U.S. Pat. No. 5,370,739, which is incorporated herein it its entirety by express reference thereto. The plasma radicals and ions are drawn to the upper surface 29 of substrate 28. Generally, the rotation rate can vary from 0 rpm to 1,500 rpm. About 100 rpm is preferred. Further, matched flow does not appear to be critical but can be employed.

With a spacing of about 25 mm between the showerhead and the substrate 28, the created plasma is much closer to the substrate surface 29. With the showerhead 36 acting as an RF electrode, a more uniform plasma is generated, therefore enhancing the uniformity of radical and ion density at the substrate 28 and thereby improving reaction rate.

When employing this apparatus, the electrode is biased—generally at a frequency from about 13.56 MHZ (a frequency which is authorized by the Federal Communication Commission)—down to about 55 KHz. Initially, the wafer is placed within the reactor 20 and both the temperature and pressure are established and stabilized. A temperature should be selected to optimize the various reactions which will be conducted, and generally should be from 400° C. to about 650° C.

Likewise, the pressure should be established and stabilized initially and then maintained throughout the process. The pressure can be anywhere from about 500 millitorr up to about 10 torr, with about 5 torr being preferred.

Figure 2A:
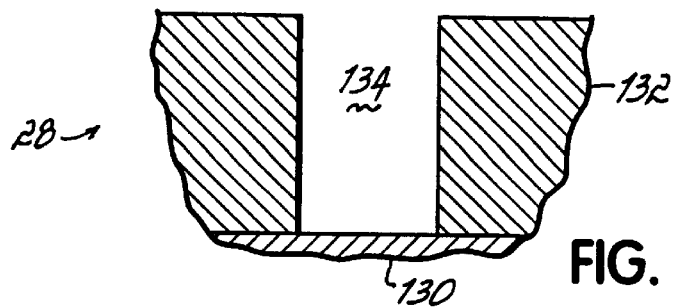
FIG. 2A–FIG. 2D are schematic cross-sections showing the formation of a $TiSi_2$ layer in a via.
Figure 2B:
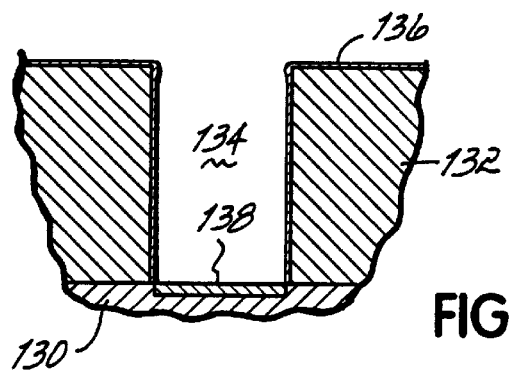
Figure 2C:
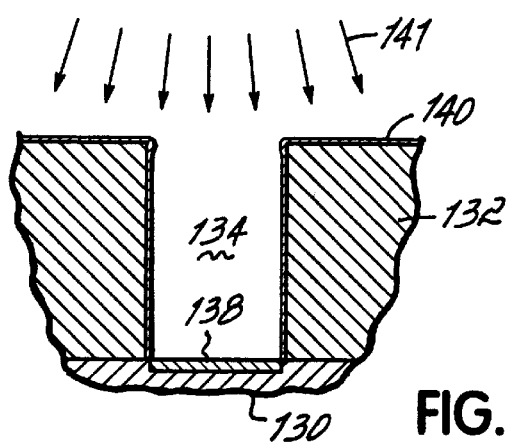
Figure 2D:
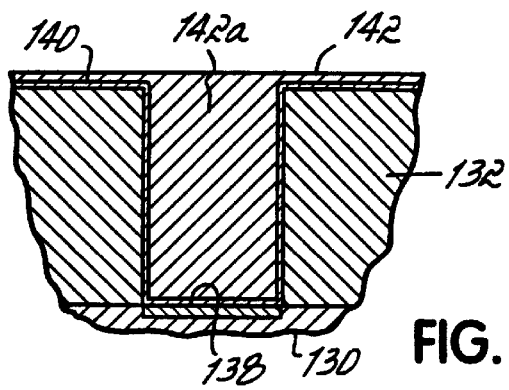

The titanium film is deposited by PE-CVD, as disclosed in U.S. Pat. No. 5,567,243 (herein incorporated by reference) and U.S. application Ser. No. 08/489,040, filed Jun. 9, 1995 (also incorporated by reference). According to this method, titanium tetrahalide is combined with a reducing gas and formed into a plasma using RF energy. The titanium is then deposited upon a substrate 28. The substrate 28, as shown in FIG. 2A, is a silicon semiconductor substrate 130 with an oxide layer 132 having contacts or vias 134 (FIG. 2A). The PE-CVD-Ti forms an in-situ $TiSi_2$ layer 138 on Si substrate 130 during deposition of metallic Ti layer 136 on oxide layer 132, as shown in FIG. 2B. The kinetics of the deposition are such that an approximately 100 Å layer of metallic Ti 136 is formed on the oxide 132 while an approximately 200 A layer of $TiSi_2$ 138 is formed in the Si substrate 130.

The titanium tetrahalide can be titanium tetrabromide, titanium tetraiodide or titanium tetrachloride. Titanium tetrachloride is preferred due to cost. This titanium source gas is combined with a reducing gas, preferably hydrogen.

The flow rate will vary, depending upon the particular reactor. With the present reactor, a flow rate of $TiCl_4$ of 3 to 7 sccm is preferred; and a flow rate of hydrogen of 1,000 to 5,000 sccm is preferred. The pressure is preferably about 5 torr.

The RF energy can also be varied, depending upon the particular application. The power of the RF energy can be from about 200 watts to about 1 kilowatt at about 450 KHz to 1 MHz.

As shown in FIG. 1, the substrate is held on a susceptor 26 which can be rotated. The rotation rate can be from about 0 rpm up to about 2,000 rpm. This facilitates a pumping action which draws the plasma to the surface of the substrate. Using the present invention, the substrate temperature can be adjusted by adjusting the temperature of the susceptor 26.

The chamber 24 is then evacuated and the current to the RF power source 38 is cut. The chamber is evacuated and the etchant gases are introduced into chamber 24 via gas supply lines 56, 58 and concentric rings 50, 52. The etchant gases include titanium tetrahalide as well as one or more diluent gases such as hydrogen, helium, argon, neon or xenon. It is believed that all titanium tetrahalide gases will serve as an etchant; however only data showing the use of titanium tetrachloride are available. The etchant gases may include $TiCl_4$ flowing at 1–20 sccm and Ar flowing at 100–500 sccm or $H_2$ flowing at 1,000–5,000 sccm. The gases flow from rings 50, 52 through flow passage 44 through the showerhead electrode 36 by the dispersion holes 64. The susceptor 26 is heated to between 400° C. and 700° C., preferably about 640° C., which results in a wafer temperature of approximately 570° C.–575° C. A susceptor may be optionally rotated at a rate of up to 1,000 rpm which, in effect, pumps the etchant gas 141 laterally over the surface of the deposited titanium as shown in FIG. 1. The etchant gas flows for up to about one (1) minute. The disproportionation reaction between titanium and titanium chloride is as follows:

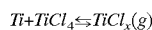

The etchant gas 141 reacts with metallic Ti layer 136 to form $TiCl_x(g)$ and expose oxide barrier layer 132. Unreacted $TiCl_4$ as well as the $TiCl_x(g)$ is drawn downwardly around baffles 27 and exits from the reaction chamber 24 through vent 53. The result of the etching process is a silicon substrate 130 having oxide layer 132 with $TiSi_2$ barrier layer 138 over exposed portions of substrate 130.

Figure 3:
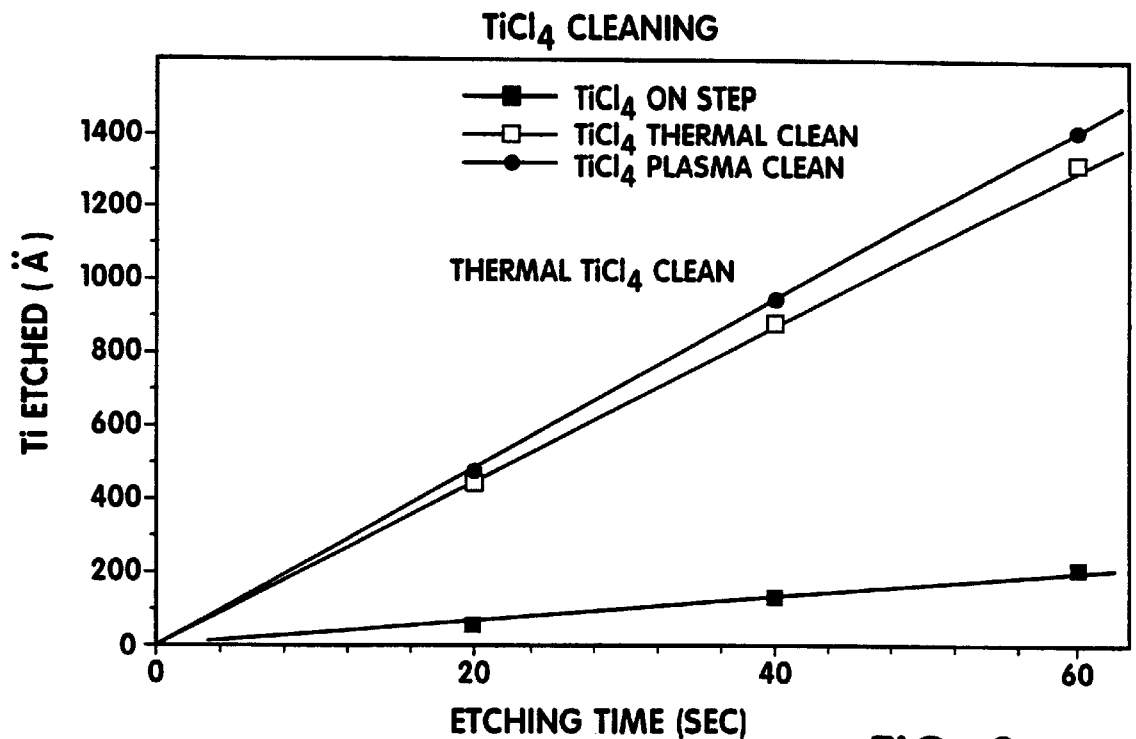
FIGS. 3–5 are graphical representations of the data from Table 1 and Table 2.
Figure 4:
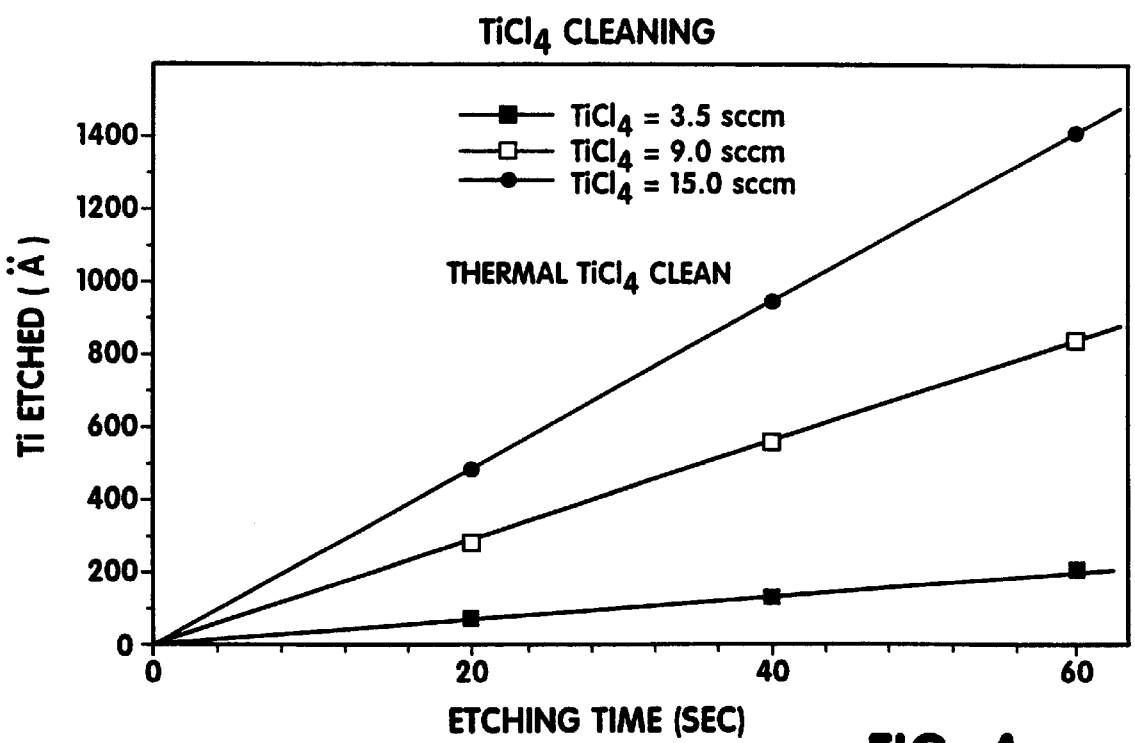
Figure 5:
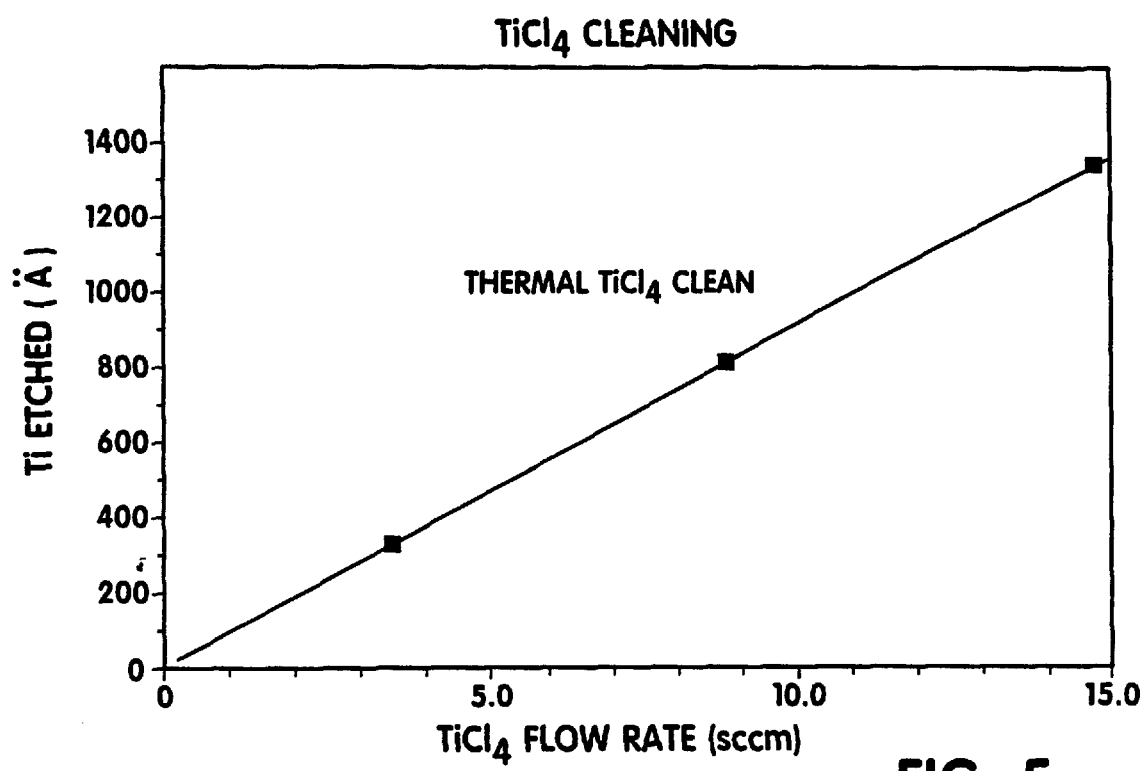

The $TiCl_4$ etches the PECVD-Ti at the rate shown in FIGS. 3–5. In Table 1, entitled PECVD-Ti\$TiCl_4$ Cleaning Test, split A shows the effect of time on etching at typical deposition conditions in the absence of an RF-field. Split A is labelled as the $TiCl_4$ ON STEP in FIG. 3. Split B shows the effect of time on etching. In Split B, the flow of gas is controlled to 20, 40 and 60 seconds respectively with a constant $TiCl_4$ flow rate of 15 sccm. Split B is labelled as $TiCl_4$ THERMAL CLEAN on FIG. 3. Split C shows the effect of plasma etching the metallic Ti with a $TiCl_4$ plasma at 20, 40 and 60 seconds. The plasma RF power source was controlled to 250 watts. Split C is labelled as $TiCl_4$ PLASMA CLEAN on FIG. 3. As can be seen in FIG. 3 the difference between the THERMAL CLEAN and PLASMA CLEAN is minimal and it is believed that the difference is due to wafer heating due to the plasma.

FIG. 4 is a graph showing the relationship between $TiCl_4$ flow and etch rate. Split D in Table 1 shows the data for a $TiCl_4$ flow rate of 3.5 sccm. Split E in Table 1 shows the data for a $TiCl_4$ flow rate of 9.0 sccm. Split F in Table 1 shows the data for a $TiCl_4$ flow rate of 15.0 sccm. Splits D, E and F are shown on FIG. 4 which shows increased etch rate at increased $TiCl_4$ flow rate. While it is not been experimentally proven it is believed that there is a theoretical maximum for etching rate regardless of increase $TiCl_4$ flow.

Table 2 summarizes the data from Splits D, E and F to provide average etch rate for given amounts of $TiCl_4$ flow as shown in FIG. 5.

Table 3 shows the etching of titanium silicide $TiSi_2$ by $TiCl_4$ at 650° C. and 5 torr. The first group of data shows the effect of $TiCl_4$ and Ar on $TiSi_2$ and the second data group shows the effect of $TiCl_4$ and $H_2$ on $TiSi_2$. These data demonstrate that only a very small amount of $TiSi_2$ is etched by titanium chloride. The average etch depth is equivalent to 7 Å $TiSi_2$ which is equal to approximately 2 monolayers of Ti. As can be seen from the results of experiments as listed in Table 3, the etching $TiSi_2$ by $TiCl_4$ is minimal.

After removal of the metallic Ti, the substrate is deposited with a LP-CVD TiN layer 140 as set forth in U.S. patent application Ser. No. 08/401,859, filed Mar. 10, 1995 (herein incorporated by reference) and may then be transported to a tungsten CVD module as disclosed in U.S. patent applications, Ser. Nos. 08/797,397 and 08/797,883, both entitled PROCESS FOR CHEMICAL VAPOR DEPOSITION OF TUNGSTEN ONTO A TITANIUM NITRIDE SUBSTRATE SURFACE, filed Feb. 10, 1997 (Inventor Douglas A. Webb), herein incorporated by reference in its entirety. Typically, it is more efficient to deposit tungsten in a separate module because the difference in temperature, pressure and gas mixture are sufficient to warrant the delay in changing modules. However, it is possible to perform the tungsten deposition in the

TABLE 1

PECVD-Ti/TiCl$_4$ Cleaning Test
3 pin susceptor, 150 mm beauty ring, quartz showerhead insulator, 25 mm TiCl4 ring, M/N on gas box
Susceptor Temp = 640 deg. C., 1/M-25/0, (Wafer Temp = 570–575 deg. C.), 150 mm wafer

| | | | Etching Conditions | | | | | | | Result Ti Etch | Res |
|---|---|---|---|---|---|---|---|---|---|---|---|
| Split | Wafer type* | Recipe Name | TiCl4 (sccm) | Ar (sccm) | H2 (sccm) | Rf (Watt) | Press (Torr) | Backside (Torr) | Time (sec) | (XRF) (Å) | Etch rate (Å/min) |
| A | Ti/Oxide | TiCl4 ON 20 sec | 3.5 | 300 | 1500 | 0 | 5 | 2 | 20 | 43 | 170 |
| | Ti/Oxide | TiCl4 ON 40 sec | 3.5 | 300 | 1500 | 0 | 5 | 2 | 40 | 121 | |
| | Ti/Oxide | TiCl4 ON 60 sec | 3.5 | 300 | 1500 | 0 | 5 | 2 | 60 | 176 | |
| B | Ti/Oxide | TiCl4 Thermal 20s | 15.0 | 300 | 0 | 0 | 5 | 2 | 20 | 410 | 1273 |
| | Ti/Oxide | TiCl4 Thermal 40s | 15.0 | 300 | 0 | 0 | 5 | 2 | 40 | 852 | |
| | Ti/Oxide | TiCl4 Thermal 60s | 15.0 | 300 | 0 | 0 | 5 | 2 | 60 | 1284 | |
| C | Ti/Oxide | TiCl4 Plasma 20s | 15.0 | 300 | 0 | 250 | 5 | 2 | 20 | 418 | 1346 |
| | Ti/Oxide | TiCl4 Plasma 40s | 15.0 | 300 | 0 | 250 | 5 | 2 | 40 | 903 | |
| | Ti/Oxide | TiCl4 Plasma 60s | 15.0 | 300 | 0 | 250 | 5 | 2 | 60 | 1371 | |
| D | Ti/Oxide | TiCl4 Th 3.5 20s | 3.5 | 300 | 0 | 0 | 5 | 2 | 20 | 112 | 313 |
| | Ti/Oxide | TiCl4 Th 3.5 40s | 3.5 | 300 | 0 | 0 | 5 | 2 | 40 | 208 | |
| | Ti/Oxide | TiCl4 Th 3.5 60s | 3.5 | 300 | 0 | 0 | 5 | 2 | 60 | 305 | |
| | Ti/Oxide | TiCl4 Th 9 20s | 9.0 | 300 | 0 | 0 | 5 | 2 | 20 | 269 | 790 |
| E | Ti/Oxide | TiCl4 Th 9 40s | 9.0 | 300 | 0 | 0 | 5 | 2 | 40 | 525 | |
| | Ti/Oxide | TiCl4 Th 9 60s | 9.0 | 300 | 0 | 0 | 5 | 2 | 60 | 785 | |
| F | Ti/Oxide | TiCl4 Thermal 20s | 15.0 | 300 | 0 | 0 | 5 | 2 | 20 | 423 | 1294 |
| | Ti/Oxide | TiCl4 Thermal 40s | 15.0 | 300 | 0 | 0 | 5 | 2 | 40 | 859 | |
| | Ti/Oxide | TiCl4 Thermal 60s | 15.0 | 300 | 0 | 0 | 5 | 2 | 60 | 1305 | |

*PVD-Ti (2300Å on Oxide)

TABLE 2

PECVD-Ti/TiCl$_4$ Cleaning Test
3 pin susceptor, 150 mm beauty ring, quartz showerhead insulator, 25 mm TiCl4 ring, M/N on gas box
Susceptor Temp = 640 deg. C., 1/M-25/0, (Wafer Temp = 570–575 deg. C.), 150 mm wafer

| | | | Etching Conditions | | | | | | | Result Ti Etch | Res |
|---|---|---|---|---|---|---|---|---|---|---|---|
| Split | Wafer type* | Recipe Name | TiCl4 (sccm) | Ar (sccm) | H2 (sccm) | Rf (Watt) | Press (Torr) | Backside (Torr) | Time (sec) | (XRF) (Å) | Etch (Å/min) |
| | Ti/Oxide | TiCl4 Th 3.5 XXs | 3.5 | 300 | 0 | 0 | 5 | 2 | — | — | 313 |
| | Ti/Oxide | TiCl4 Th 9 XXs | 9.0 | 300 | 0 | 0 | 5 | 2 | — | — | 790 |
| | Ti/Oxide | TiCl4 Thermal XXs | 15.0 | 300 | 0 | 0 | 5 | 2 | — | — | 1294 |

*PVD-Ti (2300Å on Oxide)

TABLE 3

TiSi$_2$/TiCl$_4$ Etching Test

| Wafer | Time (s) | TiCl4 (sccm) | H2 (sccm) | Ar (sccm) | Pressure Torr | PREXRF (Å) | POSTXRF (Å) | Δ XRF (Å) | Rate, XRF (Å/min) | Remarks |
|---|---|---|---|---|---|---|---|---|---|---|
| TiCl4/Ar Flow MATRIX, 650 C., 5 Torr | | | | | | | | | | |
| TiCl4-Ti-1 | 15 | 2 | 0 | 1000 | 5 | 500 | 490 | −10 | | 3 break ins |
| TiCl4-Ti-2 | 15 | 5 | 0 | 1000 | 5 | 519 | 514 | −5 | | Average etch |
| TiCl4-Ti-3 | 15 | 10 | 0 | 1000 | 5 | 533 | 525 | −8 | | equals 7 Å Ti |
| TiCl4/H$_2$ Flow MATRIX, 650 C., 5 Torr | | | | | | | | | | |
| TiCl4-Ti-4 | 15 | 2 | 1000 | 0 | 5 | 517 | 506 | −11 | | |
| TiCl4-Ti-5 | 15 | 5 | 1000 | 0 | 5 | 509 | 507 | −2 | | |
| TiCl4-Ti-6 | 15 | 10 | 1000 | 0 | 5 | 509 | 501 | −8 | | | processing module used for the deposition and processing of the titanium.

In depositing the CVD-W layer, before the flow of the reactant gas containing $WF_6$ into the chamber, hydrogen gas is introduced at a flow rate of 2,000 sccm and at a pressure of 5 torr, with the wafers at temperatures of between 300 and 450° C. A circular parallel plate electrode (not shown) having a diameter of 25 cm is maintained over the substrate at a distance of 20 mm therefrom and energized with 500 watts of RF power at a frequency of 450 KHz. Tungsten deposition occurred by flowing $H_2$ gas at a rate of about 2,000 cc/min and $WF_6$ at a rate of about 300 sccm per minute producing the tungsten film 142, including plug 142A in via 134. One of ordinary skill in the art will appreciate that the pressure and flow rates may vary.

While the present invention has been illustrated by a description of various embodiments and while these embodiments have been described in considerable detail, it is not the intention of the Applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. This has been a description of the present invention, along with the preferred method of practicing the present invention as currently known. However, the invention itself should only be defined by the appended claims, wherein

We claim:

1. A method of forming a $TiSi_2$ film on exposed portions of an Si substrate, comprising the steps of:

providing a substrate having a silicon base and an overlying oxide layer which is patterned to expose portions of the silicon base;

depositing titanium on said substrate by chemical vapor deposition to form metallic titanium on said oxide layer and titanium silicide on the exposed silicon base; and subjecting said substrate to an etchant gas comprising titanium tetrahalide to remove substantially all said metallic titanium layer.

2. The method of claim 1 wherein the reaction steps are performed in a single reaction chamber without removing said substrate from said chamber until all of the reaction steps have been completed.

3. The method of claim 1 further comprising the step of: depositing a layer of titanium nitride over said titanium silicide and said exposed oxide.

4. The method of claim 3 wherein the reaction steps are performed in a single reaction chamber without removing said substrate from said chamber until all of the reaction steps have been completed.

5. The method of claim 3, further comprising the step of: depositing tungsten over the titanium nitride layer.

6. The method of claim 5 wherein said tungsten deposition step is performed by chemical vapor deposition from a $WF_6$ source gas.

7. The method of claim 1 wherein said titanium layer is formed by chemical vapor deposition from a titanium tetrahalide source gas.

8. The method of claim 7 wherein said titanium tetrahalide source gas is $TiCl_4$.

9. The method claimed in claim 1 wherein a pressure in the range of 0.5 to 10 torr is established in said reaction chamber and said pressure is maintained in said range throughout all of said reaction steps.

10. The method of claim 1 wherein said patterned oxide layer exposes a plurality of silicon electrodes separated by a plurality of silicon dioxide insulators.

11. The method of claim 1 wherein the substrate is maintained at a temperature between about 500° C. and 600° C. during said subjecting step.

12. The method of claim 11 wherein the substrate is maintained at approximately 575° C.

13. The method of claim 1 wherein the etchant gas is titanium tetrachloride.

14. The method of claim 13 wherein the flow rate of titanium tetrachloride is greater than about 3.5 sccm.

15. The method of claim 13 wherein the flow rate of titanium tetrachloride is between about 3.5 and 15 sccm.

16. The method of claim 13 wherein the titanium tetrachloride is mixed with an inert gas.

17. The method of claim 16 wherein said inert gas is hydrogen flowing at approximately 300–1,550 sccm.

18. The method of claim 16 wherein said inert gas is argon flowing at approximately 300–1,500 sccm.

19. The method of claim 1 wherein said etchant gas energized to form a plasma.

20. The method of claim 19 wherein the plasma energy is a 250 watt RF field.

21. A method of forming titanium silicide over at least one selected region of silicon on a semiconductor substrate adjacent an oxide layer, comprising the steps of:

depositing titanium over a surface of a semiconductor substrate including a selected region of silicon by plasma-enhanced chemical vapor deposition of titanium, thereby forming titanium silicide on said selected region of silicon and metallic titanium on the adjacent oxide layer; and exposing said metallic titanium to titanium tetrachloride to etch the titanium.

22. The method of claim 21 wherein said selected region of silicon defines one or more electrodes.

23. The method of claim 21 wherein said selected region of silicon defines a discontinuity selected from the group consisting of holes and vias.

* * * * *

UNITED STATES PATENT AND TRADEMARK OFFICE
CERTIFICATE OF CORRECTION

PATENT NO. : 5,926,737
DATED : July 20, 1999
INVENTOR(S) : Ameen et al.

It is certified that error appears in the above-indentified patent and that said Letters Patent is hereby corrected as shown below:

Column 1, line 23 reads "TiSix" and should read --TiSi$_x$--.

Column 1, line 24 reads "suicides" and should read --silicides--.

Column 3, line 1 reads "suicide" and should read --silicide--.

Column 5, line 40 reads "200A" and should read --200Å--.

Signed and Sealed this

Eleventh Day of July, 2000

*Attest:*

Q. TODD DICKINSON

*Attesting Officer*  *Director of Patents and Trademarks*